US009384819B2

(12) United States Patent
Takai

(10) Patent No.: US 9,384,819 B2
(45) Date of Patent: Jul. 5, 2016

(54) SEMICONDUCTOR DEVICE LATCHING DATA SIGNAL IN RESPONSE TO STROBE SIGNAL AND INFORMATION PROCESSING SYSTEM INCLUDING THE SAME

(71) Applicant: PS4 Luxco S.a.r.l., Luxembourg (LU)

(72) Inventor: Yasuhiro Takai, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/727,115

(22) Filed: Jun. 1, 2015

(65) Prior Publication Data

US 2015/0262647 A1    Sep. 17, 2015

Related U.S. Application Data

(63) Continuation of application No. 13/603,020, filed on Sep. 4, 2012, now Pat. No. 9,047,927.

(30) Foreign Application Priority Data

Sep. 16, 2011   (JP) .................. 2011-202787

(51) Int. Cl.
*G11C 7/00* (2006.01)
*G11C 11/4076* (2006.01)
*G11C 7/04* (2006.01)
*G11C 7/10* (2006.01)
*G11C 7/22* (2006.01)
*G11C 11/4096* (2006.01)
*G11C 11/4093* (2006.01)

(52) U.S. Cl.
CPC .............. *G11C 11/4076* (2013.01); *G11C 7/04* (2013.01); *G11C 7/1066* (2013.01); *G11C 7/1093* (2013.01); *G11C 7/222* (2013.01); *G11C 11/4093* (2013.01); *G11C 11/4096* (2013.01)

(58) Field of Classification Search
CPC ..... G11C 11/4076; G11C 7/04; G11C 7/1066; G11C 7/1093
USPC .............. 365/189.05, 193, 194, 206
See application file for complete search history.

(56) References Cited

U.S. PATENT DOCUMENTS

| | | | | |
|---|---|---|---|---|
| 4,565,993 A * | 1/1986 | Brian | ...................... | H03M 1/00 327/91 |
| 5,638,418 A * | 6/1997 | Douglass | ................ | G01K 1/028 374/102 |
| 6,466,491 B2 * | 10/2002 | Yanagawa | ............ | G06F 13/1689 365/193 |
| 6,467,043 B1 * | 10/2002 | LaBerge | ...................... | 713/401 |
| 6,469,558 B1 * | 10/2002 | Shepston | .................. | H03K 5/08 327/264 |
| 6,680,874 B1 * | 1/2004 | Harrison | .................. | G11C 8/18 327/156 |
| 6,708,298 B2 * | 3/2004 | Corbin et al. | .................. | 714/702 |
| 6,850,856 B1 * | 2/2005 | Gauthier | .................. | G06F 1/32 327/51 |
| 6,882,238 B2 * | 4/2005 | Kurd | ........................ | G01K 7/32 331/185 |
| 6,889,334 B1 * | 5/2005 | Magro et al. | .................. | 713/500 |
| 7,117,382 B2 * | 10/2006 | Khieu et al. | .................. | 713/401 |
| 7,342,838 B1 * | 3/2008 | Sharpe-Geisler et al. | ..... | 365/193 |
| 7,605,668 B2 * | 10/2009 | Fayneh | .................... | H03B 5/20 331/36 C |
| 7,859,299 B1 * | 12/2010 | Gay et al. | ........................ | 326/30 |
| 7,961,033 B2 * | 6/2011 | Meninger | ............. | H03L 7/0812 327/512 |
| 8,315,109 B2 * | 11/2012 | Mochizuki | .......... | G06F 13/1673 365/189.05 |

(Continued)

*Primary Examiner* — Viet Q Nguyen

(57) ABSTRACT

Disclosed herein is a device including a timing control circuit that receives a strobe signal supplied from outside to generate an internal strobe signal that is used as a timing signal to latch a data signal. An operation state of the timing control circuit is changed according to temperature change so as to keep an output timing of the internal strobe signal with respect to an input timing of the strobe signal.

17 Claims, 6 Drawing Sheets

(56) References Cited

U.S. PATENT DOCUMENTS

| | | | |
|---|---|---|---|
| 9,047,927 B2* | 6/2015 | Takai | |
| 9,171,588 B2* | 10/2015 | Ide | G11C 5/04 |
| 2003/0086303 A1* | 5/2003 | Jeong | 365/189.05 |
| 2003/0147299 A1* | 8/2003 | Setogawa | 365/233 |
| 2007/0204185 A1* | 8/2007 | Ogura | 713/500 |
| 2008/0157880 A1* | 7/2008 | Fayneh | H03L 7/0891 331/17 |
| 2009/0168565 A1* | 7/2009 | Kim et al. | 365/193 |
| 2012/0069686 A1* | 3/2012 | Nakabayashi | G11C 7/1066 365/189.05 |
| 2012/0163101 A1* | 6/2012 | Kato | 365/189.06 |

\* cited by examiner

SEMICONDUCTOR DEVICE LATCHING DATA SIGNAL IN RESPONSE TO STROBE SIGNAL AND INFORMATION PROCESSING SYSTEM INCLUDING THE SAME

CROSS-REFERENCE TO RELATED APPLICATIONS

This application is a continuation of U.S. patent application Ser. No. 13/603,020, filed Sep. 4, 2012, now U.S. Pat. No. 9,047,927, issued Jun. 2, 2015, which is based upon and claims the benefit of priority from Japanese patent application No. 2011-202787, filed Sep. 16, 2011, the disclosures of which are incorporated herein in their entireties by reference.

BACKGROUND OF THE INVENTION

1. Field of the Invention

The present invention relates to a semiconductor device and an information processing system including the same, and more particularly relates to a semiconductor device that controls a timing of latching data and an information processing system including the same.

2. Description of Related Art

Semiconductor devices such as a DRAM (Dynamic Random Access Memory) often control timings of latching data by using a strobe signal (see Japanese Patent Application Laid-open Nos. H4-96419 and 2010-045569). To correctly latch data, it is important to match a timing of a strobe signal to a flow of the data with high accuracy. Accuracy in matching the timing has been more severely required as the speed of the DRAM has become higher.

For this purpose, a type of calibration called "training operation" is sometimes performed at startup of a semiconductor device. The training operation is performed in a system including the semiconductor and a controller that controls the semiconductor device. In the training operation, an appropriate timing range in which the semiconductor device can correctly latch data is scanned and specified by the controller while a timing of a strobe signal supplied by the controller is shifted. Therefore, when the training operation ends, the strobe signal supplied from the controller is matched with write data supplied from the controller with high accuracy.

The system needs to periodically perform the training operation even after startup of the semiconductor because the timing between the write data and the strobe signal may be deviated due to temper, temperature change.

Data accesses to a semiconductor device during the training operation are prohibited. Furthermore, the training requires a certain time. Therefore, overhead or a busy period caused by the training operation reduces performance in a system level. Accordingly, the number of times of calibration operation of the system with respect to temperature changes needs to be reduced.

SUMMARY

In one embodiment, there is provided an information processing system that includes: a controller; a semiconductor device; a plurality of bus lines coupled between the controller and the semiconductor device to transfer a plurality of data signals from the controller to the semiconductor device; and a strobe line coupled between the controller and the semiconductor device to transfer a strobe signal from the controller to the semiconductor device. The controller includes: a data generation circuit that supplies the data signals to the bus lines; and a strobe generation circuit that supplies the strobe signal to the strobe line. The semiconductor device includes: a plurality of latch circuits each latches an associated one of the data signals supplied via the bus lines in response to an internal strobe signal; and a timing control circuit that is configure to generate a control signal related to an operating temperature of the device and the internal strobe signal in response to both the control signal and the strobe signal.

In another embodiment, there is provided a semiconductor device that includes: a first terminal supplied with a data signal; a second terminal supplied with a strobe signal; a temperature detection circuit; a timing control circuit coupled to the second terminal and the temperature detection circuit to generate an internal strobe signal; and a latch circuit coupled to the first terminal and the timing control circuit to capture the data signal in response to the internal strobe signal.

In still another embodiment, there is provided a semiconductor device that includes: a timing control circuit that receives a strobe signal calibrated with respect to a plurality of data signals to generate an internal strobe signal; and a plurality of latch circuits each latches an associated one of data signals in response to the internal strobe signal. The timing control circuit suppresses a deviation between the internal strobe signal and the data signals according to temperature changes to substantially maintain a calibrated condition.

DETAILED DESCRIPTION OF THE EMBODIMENT

The inventor of the present invention founds the following. A strobe signal output from the controller is supplied to a receiver via a strobe pad of a semiconductor device. In the semiconductor device, the receiver supplies the strobe signal to a latch circuit that latches write data supplied to the semiconductor device, as a latch timing signal. Because the strobe signal has a small amplitude, an amplification time of the receiver is relatively long. To be supplied to a plurality of latch circuits, a latch timing signal generated based on the strobe signal is transmitted via a relatively long signal line in the semiconductor device. Therefore, a first time period which is a sum of an operation time of the receiver and a transmission time resulting from parasitic capacitance and parasitic resistance of the signal line is long. On the other hand, a second time period resulting from a transmission time of write data to be supplied from outside of the semiconductor device to the latch circuits is shorter than the first time period. This is because a distance from a data pad to which the write data is supplied to the latch circuits is generally shorter than the signal line of the strobe signal. While the first and second time periods are both affected by temperature changes, the receiver and the longer signal line of the latch timing signal generated based on the strobe signal have greater temperature dependency. That is, the latch timing signal has greater temperature dependency than a data signal. This involves a factor of an increase in the number of times of training operation with respect to the temperature changes in the system or the semiconductor device.

Figure 1:
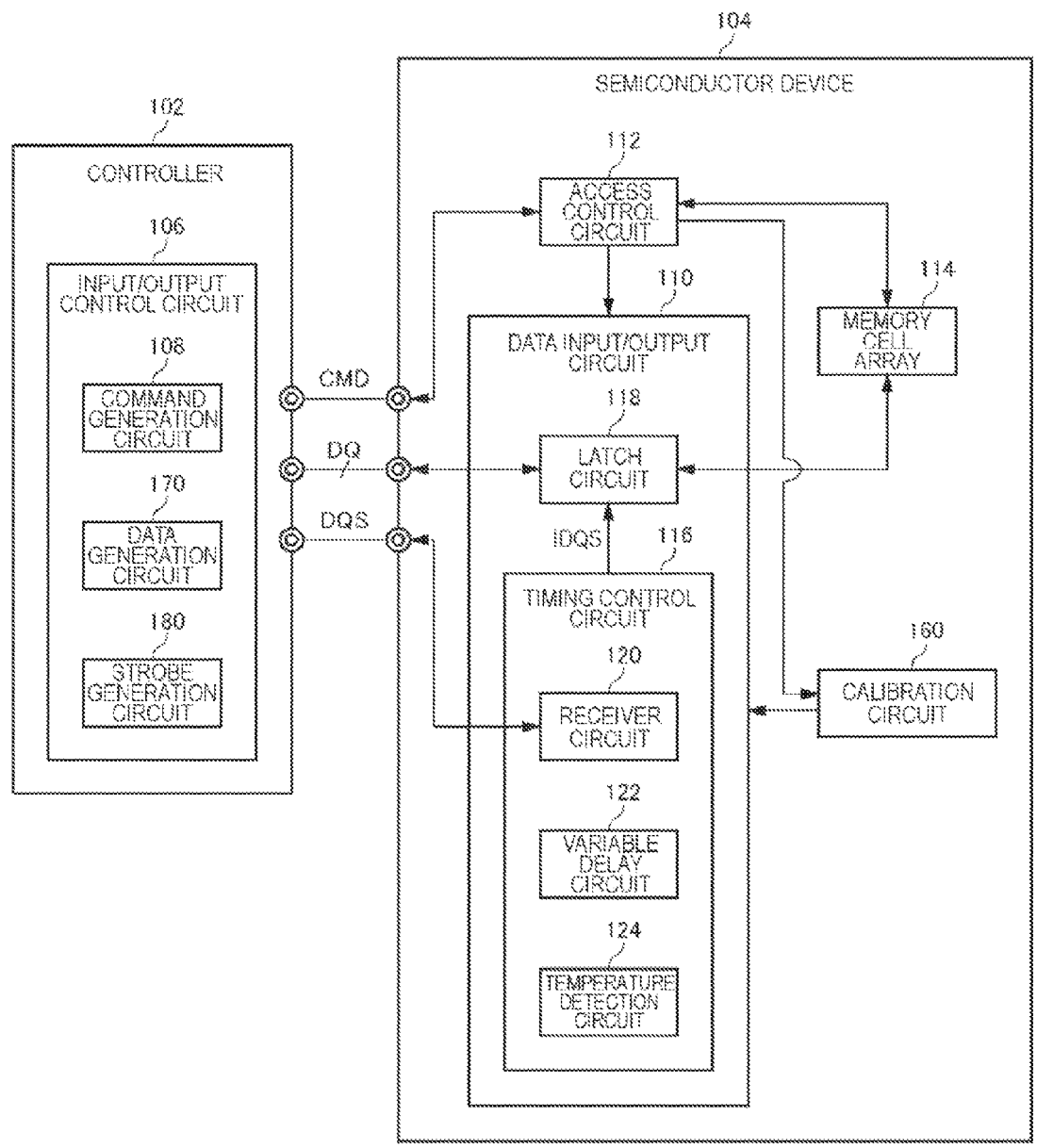
FIG. 1 is a functional block diagram of an information processing system according to an embodiment of the present invention.

Referring now to FIG. 1, the information processing system 100 includes a semiconductor device 101 and a controller 102 that controls the semiconductor device 104. The semiconductor device 104 according to the embodiment of the present invention is a DDR (Double Date Rate) SDRAM (Synchronous Dynamic Random Access Memory).

The controller 102, and the semiconductor device 104 are connected to each other with a data bus line for transmitting data DQ, a strobe line for transmitting a strobe signal DQS, a command line for transmitting various commands CMD, and various signal lines such as an address line (not shown). The data bus line DQ includes a plurality of signal lines. The strobe signal DQS is used as a base signal for latch timings of a plurality of data DQ. The commands CMD transmitted from the controller 102 to the semiconductor device 104 include a training command that indicates a training operation. The training command is for adjusting a timing of the strobe signal DQS in order to match the strobe signal DQS to the data DQ by calibration operation performed.

The controller 102 includes an input/output control circuit 106 serving as an interface circuit to the semiconductor device 104. The input/output control circuit 106 includes a command generation circuit 108, a data generation circuit 170, and a strobe generation circuit 180.

The command generation circuit 108 generates the various commands CMD including the training command and transmits the commands CMD to the semiconductor device 104 via the command line.

The data generation circuit 170 generates data DQ to be supplied to the semiconductor device 104 and transmits the data DQ to the semiconductor device 104 via the data bus line. The strobe generation circuit 180 generates a strobe signal DQS and transmits the strobe signal DQS to the semiconductor device 104 via the strobe line. The input/output control circuit 106 adjusts the timing of the strobe signal DQS based on a determination result signal (not shown) determined by the semiconductor device 104 in response to the training command.

The semiconductor device 104 includes an access control circuit 112, a memory cell array 114, a data input/output circuit 110, and a calibration circuit 160. The access control circuit 112 performs an access operation to the memory cell array 114 and includes an address decoder, a command decoder, a control logic, and the like. The access control circuit 112 also controls the calibration circuit 160 and the data input/output circuit 110. The data input/output circuit 110 performs data transmission/reception to/from memory cells in the memory cell array 114 selected by the access control circuit 112 under the control of the access control circuit 112. The calibration circuit 160 determines whether the data DQ to be supplied to the data input/output circuit 110 is properly latched according to the strobe signal DQS in response to a training command recognized by the access control circuit 112 and generates a determination result signal. The calibration circuit 160 trans the determination result signal to the controller 102 via the data input/output circuit 110.

The data input/output circuit 110 includes a timing control circuit 116 and a latch circuit 118. The latch circuit 118 latches the data DQ supplied from the controller 102. A latch timing of the data DQ is specified by an internal strobe signal IDQS supplied from the timing control circuit 116. The timing control circuit 116 adjusts an output timing of the internal strobe signal IDQS generated based on the strobe signal DQS supplied from the controller 102. This operation is performed in response to write command included in the various commands CMD mentioned above. When the semiconductor device 104 is a CPU (Central Processing Unit), an MCU (Micro Control Unit), a DSP (Digital Signal Processor), an ASIC (Application Specific Integrated Circuit), or an ASSP (Application Specific Standard Circuit), for example, not the memory device, the write command corresponds to a data transfer command. While the data DQ and the strobe signal DQS are output from the data input/output circuit 110 to the controller 102 in response to a read command included in the various commands CMD, an explanation of this operation is omitted in the specification.

As shown in FIG. 1, the timing control circuit 116 includes a receiver circuit 120, a variable delay circuit 122, and a temperature detection circuit 124. The timing control circuit 116 receives the strobe signal DQS through the receiver circuit 120 and adjusts the output timing of the internal strobe signal IDQS by adjusting a delay amount of the variable delay circuit 122 according to a temperature signal supplied from the temperature detection circuit 124. Although the temperature detection circuit 124 is not necessarily incorporated in the timing control circuit 116 or the data input/output circuit 110, the present embodiment is explained assuming that the temperature detection circuit 124 is incorporated in the timing control circuit 116. Because many of the DRAMs already have the temperature detection circuit 124 for other purposes, this temperature detection circuit 124 can be used.

Figure 2:
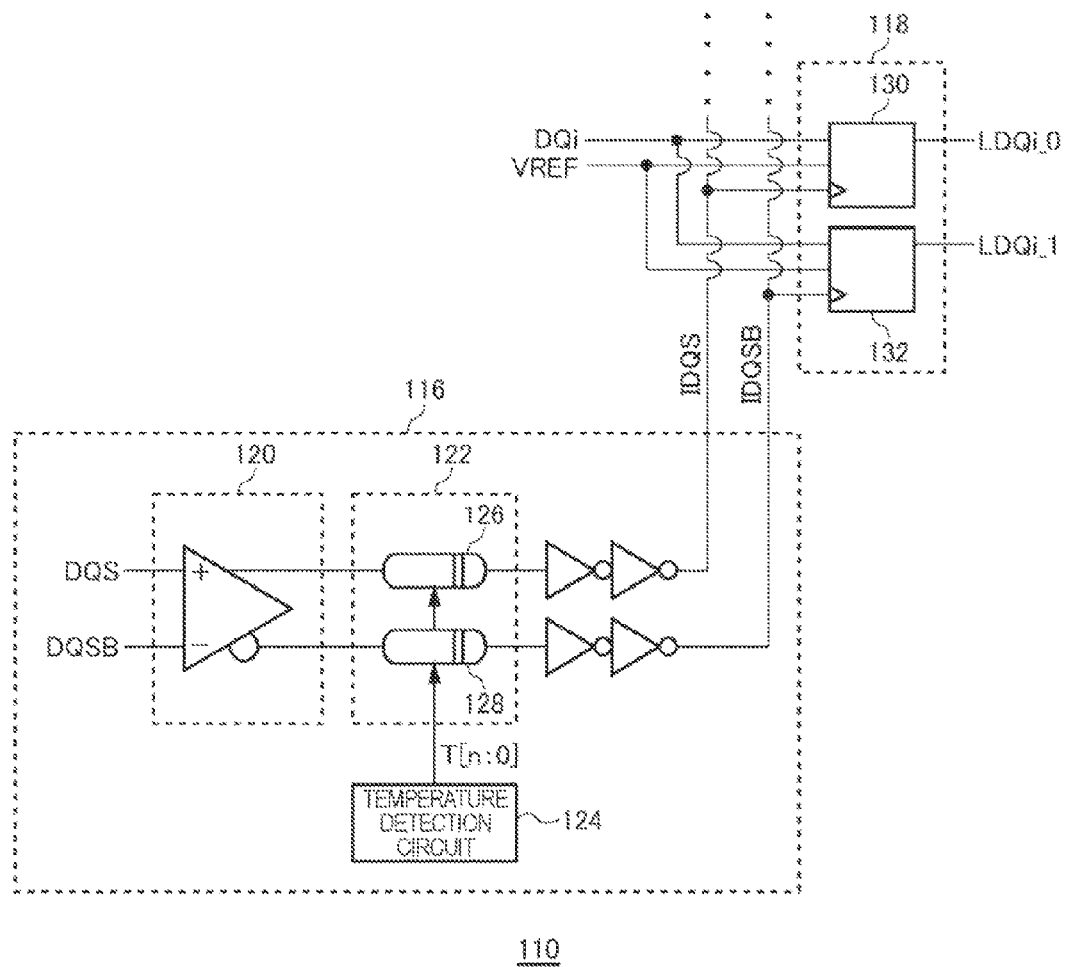
FIG. 2 is a circuit diagram showing a timing control circuit and a latch circuit shown in FIG. 1.

As mentioned above, the data input/output circuit 110 includes the latch circuit 118 and the timing control circuit 116. As shown in FIG. 2, a strobe signal DQS (first strobe signal) and a strobe signal DQSB (second strobe signal) complementary to each other are supplied to the receiver circuit 120. The strobe signals DQS and DQSB pass through the variable delay circuit 122 and are supplied to the latch circuit 118 as internal strobe signals IDQS and IDQSB complementary to each other, respectively. The internal strobe signals IDQS and IDQSB transfer through internal strobe signal lines. The variable delay circuit 122 includes a first variable delay circuit 126 and a second variable delay circuit 128. The internal strobe signal IDQS having a normal phase passes through the first variable delay circuit 126 and the internal strobe signal IDQSB having a reverse phase passes through the second variable delay circuit 128.

The latch circuit 118 includes a first latch circuit 130 and a second latch circuit 132. The internal strobe signal IDQS having normal-phase is supplied to the first latch circuit 130 and the internal strobe signal IDQSB having reverse-phase is supplied to the second latch circuit 132. The internal strobe signal IDQS and the internal strobe signal IDQSB are supplied to a plurality of the latch circuits 118 in common. Each of the plurality of latch circuits 118 corresponds to an associated one of bit data D0, D1, D2 and D3 that are serially supplied from the controller 102 and constitute a set of internal data DQi. A reference voltage VREF and the internal data DQi are also supplied to the first latch circuit 130 and the second latch circuit 132 in common. The internal data DQi indicate data supplied to inside of the data input/output circuit 110 from the controller 102. The internal data DQi are a data sequence of bits temporally continuing, in other words, data sequentially supplied. The internal data DQi are supplied to both of the first latch circuit 130 and the second latch circuit 132. The bit data D0, D1, D2 and D3 constituting the internal data DQi are latched alternately by the first latch circuit 130 and the second latch circuit 132 corresponding to the internal strobe signal IDQS and the internal strobe signal TDQSB, respectively. Details thereof are explained later.

A temperature signal T is supplied from the temperature detection circuit 124 to the first variable delay circuit 126 and the second variable delay circuit 128. The temperature signal T in the present embodiment is a 2-bit signal and indicates temperatures using four values of 00, 01, 10, and 11 in ascending order. More specifically, T=00 when a temperature is lower than 0° C., T=01 when a temperature is between 0 and 40° C., T=10 when a temperature is between 10 and 80° C., and T=11 when a temperature is equal to or higher than 80° C. The first variable delay circuit 126 and the second variable delay circuit 128 change a delay amount thereof based on the temperature signal T. Details of the variable delay circuit 122 are explained later in association with FIG. 5.

Figure 3:
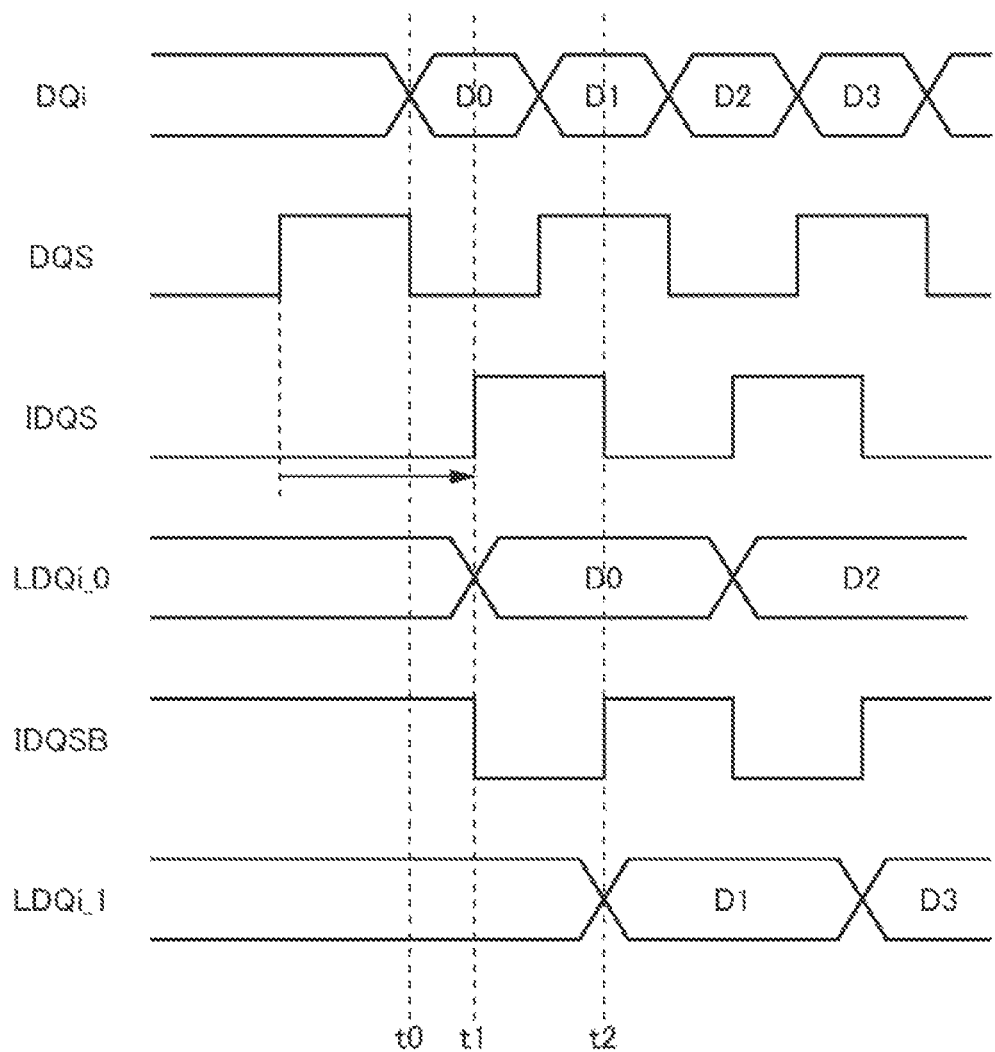
FIG. 3 is a timing chart for explaining an operation of the timing control circuit and the latch circuit.

Turning to FIG. 3, the internal data DQi including bit data D0, D1, D2 and D3 are sequentially supplied to the receiver circuit 120. In FIG. 3, the first bit D0 is supplied to the latch circuit 118 at a time t0. The strobe signal DQS is timing-adjusted (initially set) by training operation performed at the startup sequence of the semiconductor device 104 to cause a rising edge of the internal strobe signal IDQS to appear at a time t1. The time t1 is the exact center of a detection period of the data bit D0. The first latch circuit 130 latches the data bit D0 at a timing of the rising edge of the internal strobe signal IDQS, that is, at the time t1.

On the other hand, a rising edge of the internal strobe signal IDQSB having reverse-phase appears at a time t2. The time t2 is the exact center of a detection period of the data bit D1. The second latch circuit 132 latches the data bit D1 at the time t2, which is the timing of the rising edge of the internal strobe signal IDQSB. As a result, the bit sequence D0, D1, D2, D3 constitute the internal data DQi is alternately latched by the first latch circuit 130 and the second latch circuit 132. That is, a cycle of data latch by the first latch circuit 130 or the second latch circuit 312 is twice as long as a cycle of data change of the internal data DQi.

When the semiconductor device 104 is operated, a temperature of the circuit included therein gradually increases. When the temperature increases, transmission speeds of the internal strobe signals IDQS and IDQSB become lower. This is because a current capability of a MOS transistor reduces as the temperature increases, which increases a transmission time in the receiver circuit 120 and reduces a drive capability of the internal strobe signal line. This is also because the parasitic resistors of the internal strobe signal lines that connect the timing control circuit 116 and the latch circuits 118 have resistance values that change according to temperatures, which changes a time constant CR. The internal strobe signal lines for transmitting the internal strobe signals IDQS and IDQSB are normally longer than an internal data line for transmitting the internal data DQi and consequently rising edges of the internal strobe signals IDQS and IDQSB are delayed from the internal data DQi. To correct delays of the internal strobe signals IDQS and IDQSB, it is necessary to periodically perform the training operation, i.e., calibration operation of the data DQ and the strobe signal DQS in response to the training command. However, frequent training leads to reduction of performance in the system level.

In the present embodiment, the delay amount of the variable delay circuit 122 is changed according to the temperature signal T output from the temperature detection circuit 124. Specifically, the delay amount is reduced as the temperature increases. Such a control can cancel a transmission delay with an increase in the temperature, thereby to keep a timing matched between the data DQ and the strobe signal DQS calibrated at an arbitrary temperature. The temperature signal T can be either a digital signal or an analog signal. Therefore, if the training operation is performed only once preferably immediately after startup sequence of the semiconductor device 104, it becomes unnecessary to perform the training operation after that. An adjustment time of the variable delay circuit 122 is quite shorter than a time required for the training operation. While data accesses, such as a data transfer operation in response to a write command or a transfer command, can be allowed during the adjustment by the variable delay circuit 122, the accesses are prohibited in the present embodiment. In a system, transmission or reception of data between two devices is generally performed by handling a predetermined number of data bits as one unit. In a memory, transfer of sequential data bits of 8 bits or 16 bits by burst write operation is performed. The access prohibition mentioned above means that even when information of the temperature signal T changes during a period of transfer of sequential data bits of 16 bits, for example, the delay amount of the variable delay circuit 122 is not changed. This control is effective when the temperature signal T output from the temperature detection circuit 124 is a digital signal. This is because the delay amount of the internal strobe signals IDQS and IDQSB is greatly changed by a digital signal during a period of the sequential data bits of 16 bits if a control pitch of the variable delay circuit 122 is relatively large. Reliability is higher when transfer of data bits in one unit is handled as one control unit. This control can be realized by prohibiting an output timing of transition of the temperature signal T output from the temperature detection circuit 124 during a period when the access control circuit 112 handling a write command, for example. When the temperature signal T output from the temperature detection circuit 124 is an analog signal, the control of prohibition mentioned above is not necessary.

It is unnecessary to limit the training operation to once immediately after startup sequence such as after cold start, after hardware reset, after power-down exit, and after resume. The training operation can be also performed periodically when the system is in an idle state after startup, as in the conventional technique. At least, there is no need to perform the training operation unduly if the adjustment by the variable delay circuit 122 is performed.

Figure 4:
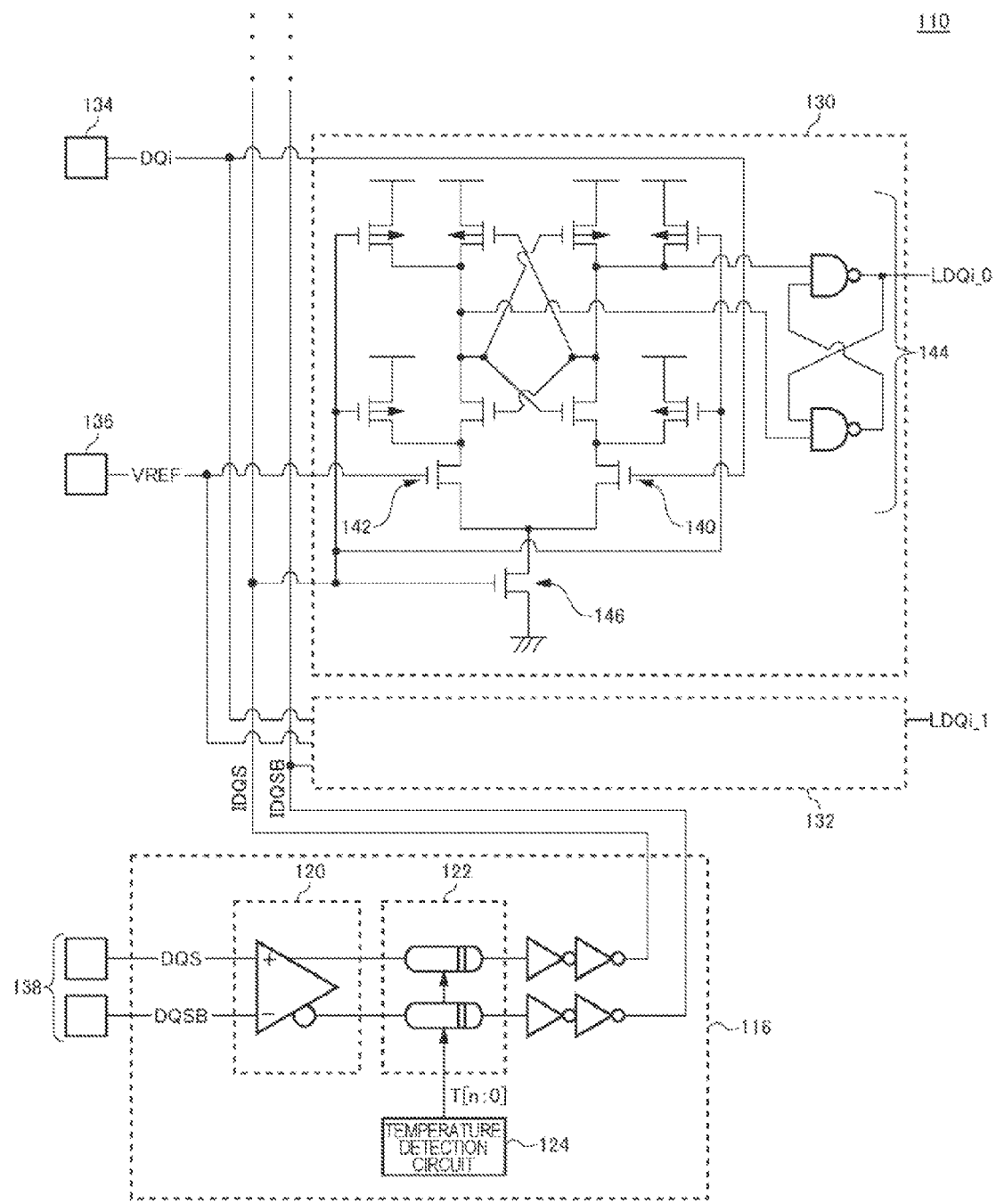
FIG. 4 is a detailed circuit diagram of the data input/output circuit shown in FIG. 1.

Turning to FIG. 4, the data input/output circuit 110 is connected to a data terminal 134 serving as an input terminal of the internal data DQi, a reference voltage terminal 136 serving as an input terminal of the reference voltage VREF, and a strobe terminal 138 serving as input terminals of the strobe signals DQS and DQSB. The data DQi is supplied to a transistor serving as a first input unit 140. The reference voltage VREF is supplied to another transistor serving as a second input unit 142. The first input unit 140 and the second input unit 142 are activated by one of the internal strobe signals IDQS and IDQSB that is supplied to a transistor serving as an activation control unit 146. As shown in FIG. 4, the first latch circuit 130 is activated by the internal strobe signal IDQS and the second latch circuit 132 is activated by the internal strobe signal IDQSB. This means that the first latch circuit 130 and the second latch circuit 132 is alternatively activated.

Each of the first and second latch circuits 130 and 132 includes a determining unit 144 that is configured as a differential amplifier circuit. The determining unit 144 included in the first latch circuit 130 outputs an internal data signal LDQi_0. The determining unit 144 included in the second latch circuit 132, outputs an internal data signal LDQi_1.

Each of the internal data signals LDQi_0 and LDQi_1 is a binary signal that takes one of a high level and a low level according to ON/OFF states of the first input unit 140 and the second input unit 142.

Figure 5:
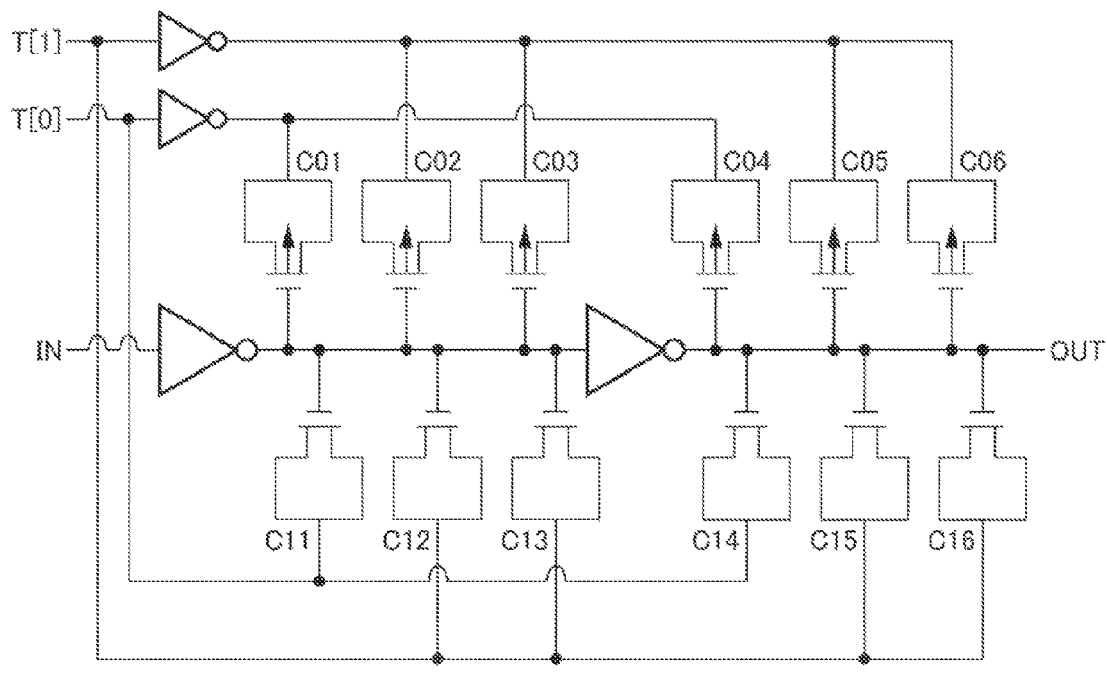
FIG. 5 is a circuit diagram of the first variable delay circuit shown in FIG. 2.

Turning to FIG. 5, the delay amount of the first variable delay circuit 126 is controlled by digital signals T[0] and T[1]. The second variable delay circuit 128 has the same configuration as that of the first variable delay circuit 126 shown in FIG. 5. Voltages of the digital signals T[0] and T[1] are binary that take one of voltage VDD and VSS. AS shown in FIG. 5, twelve capacitors C01-C06 and C11-C16 are connected to the transmission channel for transmitting the strobe signal DQS. The digital signal T[0] controls four capacitors C01, C04, C11, and C14 and the digital signal T[1] controls the remaining eight capacitors. That is, as the value of the temperature signal T is increased as 00, 01, 10, and 11 in this order, the delay amount of the first variable delay circuit 126 reduces in a stepwise manner. The value of the digital signals T[0] and T[1] is selected based on a total delay time that considering a change in a time constant of the transmission line for the strobe signal DQS (change in a first delay time) with temperature change and another change in a response speed and a drive capability of the receiver circuit 120 (change in a second delay time) with the temperature changes. Therefore, the digital signals T[0] and T[1] are previously set to cancel increases in the delay time due to increases in the temperature of the first variable delay circuit 126 and also to cancel increases in the delay time of the receiver circuit 120. When the digital signals T[0] and T[1] are replaced by an analog signal that is indicated by a voltage between VDD and VSS corresponding to a temperature, a signal OUT output from the first variable delay circuit 126 has a delay amount analogously controlled according to the temperature.

Figure 6:
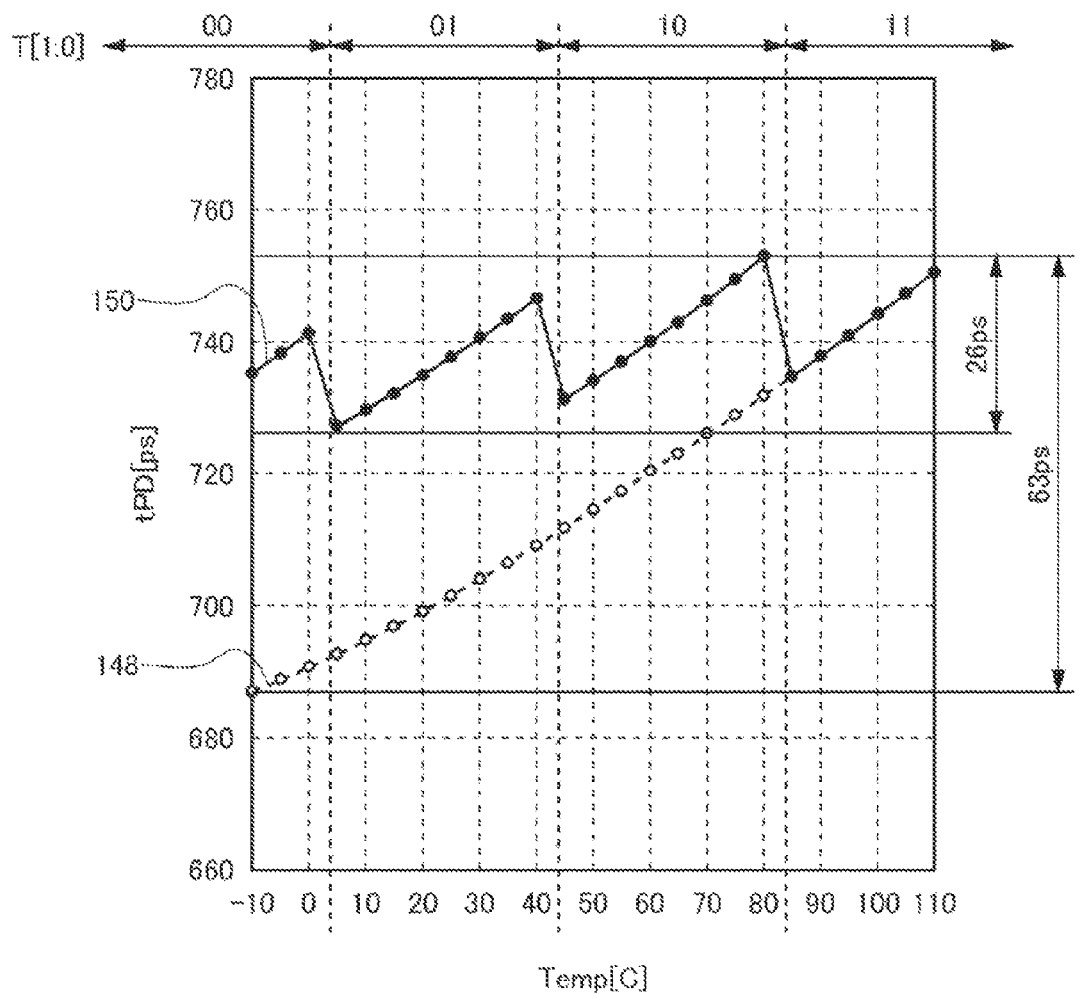
FIG. 6 is a graph showing a relation between the transmission time of a strobe signal DQS and the temperature.

Turning to FIG. 6, a relation between the transmission time of the strobe signal DQS and the temperature is explained. The horizontal axis represents the temperature and the vertical axis represents the transmission time. A reference numeral 148 indicates characteristics obtained when the adjustment operation by the variable delay circuit 122 is not performed. A reference numeral 150 indicate characteristics obtained when the adjustment operation by the variable delay circuit 122 is performed.

In the characteristics 148, the transmission time increases as the temperature increases. In a case shown in FIG. 6, the transmission time changes by about 63 picoseconds (psec) in a range from −10 to 110° C. When the temperature increases, the rising edge of the strobe signal DQS is delayed from the data DQ and thus frequent training operation is required.

In the characteristics 150, the value of the temperature signal T is increased as 00, 01, 10, and 11 in this order as the temperature increases. When the temperature exceeds 0° C., the temperature signal T changes from 00 to 01 and the delay amount of the variable delay circuit 122 is reduced. When the temperature exceeds 40° C., the temperature signal T changes from 01 to 10 and the delay amount of the variable delay circuit 122 is further reduced. When the temperature exceeds 0° C. the temperature signal T changes from 10 to 11 and thus the delay amount of the variable delay circuit 122 is further reduced. As a result, a variation range of the transmission time in the range from −10 to 110° C. is suppressed to 26 psec. When resolution is increased by increasing the number of bits of the temperature signal T, changes in the delay amount of the variable delay circuit 122 corresponding to temperature changes can be kept almost constant.

Because many DRAMs include the temperature detection circuit 124, it suffices that the timing control circuit 116 uses the temperature signal T of the existing temperature detection circuit 124 as it is. According to this embodiment, it is not necessary to search an appropriate timing range while the strobe signal DQS is shifted each time the temperature changes as in the training. It is only necessary to control the capacitor shown in FIG. 5 in the variable delay circuit 122 according to the temperature signal T. Therefore, the adjustment time becomes advantageously much shorter than that in the training operation. If the training operation is performed only once at of startup sequence of the semiconductor device 104 to initially set the timing of the strobe signal DQS, the need of subsequent training operation can be eliminated. At least, the number of times of the training operation can be greatly reduced.

A significant object of the present embodiment is to appropriately set the timing of the strobe signal DQS with respect to the data DQ to be transmitted at high speeds, without delaying the data DQ itself according to temperature changes In this sense, the object of the present embodiment is different from that described in Japanese Patent Application Laid-open No. H04-96419. While the object is conventionally achieved by the method of training operation, frequent training operation may become an obstacle to further speed-up. In contrast, the present embodiment applies a method of installing the variable delay circuit 122 on the transmission channels for the strobe signals DQS and DQSB to adjust the delay amounts thereof, and accordingly the speed-up can be easily addressed.

The memory cell array 114 of the present embodiment has no restrictions on whether it is volatile, nonvolatile, or a combination thereof. The technical concept of the present invention can be applied to various semiconductor devices having a signal transmission circuit. Furthermore, persons skilled in the art can understand that circuit forms of function blocks are not limited to those disclosed in the drawings.

The technical concept of the present invention is not limited to data bits stored in memory cells and can be applied to input of address bits that specify memory cells, for example. Furthermore, the data bits and the address bits are not limited to that of memory cells. That is, the present invention is not limited to a semiconductor memory device. The present invention can be also applied to a system that transmits data information or address information between two semiconductor devices A and B and to a logic semiconductor device or a data-processing semiconductor device that constitutes the system.

The technical concept of the present invention may be applied to, for example, semiconductor products in general, including CPUs (Central Processing Units), MCUs (Micro Control Units), DSPs (Digital Signal Processors), ASICs (Application Specific Integrated Circuits), ASSPs (Application Specific Standard Product), and memories. Examples of the product types of the semiconductor devices to which the present invention is applicable include an SOC (System On Chip), MCP (Multi Chip Package), and POP (Package On Package). The present invention may be applied to semiconductor detiices that have any of such product types and package types.

When the transistors are field effect transistors (FETs), various FETs are applicable, including MIS (Metal Insulator Semiconductor) and TFT (Thin Film Transistor) as well as MOS (Metal Oxide Semicoductor). The device may even include bipolar transistors.

The PMOS transistors are a representative example of the transistor of second conductivity type. The N-channel transistors or NMOS transistors are a representative example of the transistor of first conduit type.

It is apparent that the present invention is not limited to the above embodiments, but may be modified and changed without departing from the scope and sprit of the invention.

What is claimed is:

1. A semiconductor device comprising:
   a temperature detection circuit that provides a temperature signal indicative of a detected temperature; and
   a first variable delay circuit comprising:
      an input for receiving a first signal;
      an output for outputting a delayed first signal;
      a transmission line on which the first signal is transmitted, the transmission line being arranged between the input and output; and
      a plurality of capacitors each having a first electrode coupled to the transmission line and a second electrode that receives the temperature signal;
      wherein a delay amount between the first signal and the delayed first signal is variable based upon the temperature signal, wherein the temperature signal comprises a first bit and a second bit, and the plurality of capacitors comprises a first group of capacitors and a second group of capacitors, the second electrodes of the first group of capacitors receiving the first bit and the second electrodes of the second group of capacitors receiving the second bit.

2. The semiconductor device of claim 1, wherein the first bit and the second bit comprise binary values.

3. The semiconductor device of claim 2, wherein the delay amount is adjusted based on the binary values of the first and second bits.

4. The semiconductor device of claim 1, wherein the transmission line comprises a first inverter arranged in a path of the transmission line between the input and the output.

5. The semiconductor device of claim 4, wherein the first group of capacitors comprises:
   a first capacitor coupled, by the first electrode, to the transmission line between the input and the first inverter; and
   a second capacitor coupled, by the first electrode, to the transmission line between the first inverter and the output.

6. The semiconductor device of claim 5, wherein the second group of capacitors comprises:
   a third capacitor coupled, by the first electrode, to the transmission line between the input and the first inverter; and
   a fourth capacitor coupled, by the first electrode, to the transmission line between the first inverter and the output.

7. The semiconductor device of claim 6, wherein the second capacitor is coupled to the transmission line at a location closer to the first inverter than a location at which the fourth capacitor is coupled.

8. The semiconductor device of claim 6, wherein the first group of capacitors comprises:
   a fifth capacitor coupled, by the first electrode, to the transmission line between the input and the first inverter; and
   a sixth capacitor, coupled, by the first electrode, to the transmission line between the first inverter and the output.

9. The semiconductor device of claim 8, wherein the second group of capacitors comprises:
   a seventh capacitor coupled, by the first electrode, to the transmission line between the input and the first inverter; and
   an eighth capacitor, coupled, by the first electrode, to the transmission line between the first inverter and the output.

10. The semiconductor device of claim 9, wherein the second group of capacitors comprises:
    a ninth capacitor coupled, by the first electrode, to the transmission line between the input and the first inverter; and
    a tenth capacitor, coupled, by the first electrode, to the transmission line between the first inverter and the output.

11. The semiconductor device of claim 10, wherein the second group of capacitors comprises:
    a eleventh capacitor coupled, by the first electrode, to the transmission line between the input and the first inverter; and
    a twelfth capacitor, coupled, by the first electrode, to the transmission line between the first inverter and the output.

12. The semiconductor device of claim 11, wherein the first and fifth capacitors of the first group of capacitors are coupled to the transmission line at a location closer to the input than the third, seventh, ninth, and eleventh capacitors of the second group of capacitors, and wherein the second and sixth capacitors of the first group of capacitors are coupled to the transmission line at a location closer to the first inverter than the fourth, eighth, tenth, and twelfth capacitors of the second group of capacitors.

13. The semiconductor device of claim 12, further comprising a second inverter arranged between the input and the first inverter.

14. The semiconductor device of claim 13, wherein the first, third, fifth, seventh, ninth, and eleventh capacitors are coupled to the transmission line between the first inverter and the second inverter.

15. A semiconductor device comprising:
    a temperature detection circuit that provides a temperature signal indicative of a detected temperature; and
    a first variable delay circuit comprising:
       an input for receiving a first signal;
       an output for outputting a delayed first signal;
       a transmission line on which the first signal is transmitted, the transmission line being arranged between the input and output and
       a plurality of capacitors each having a first electrode coupled to the transmission line and a second electrode that receives the temperature signal;
       wherein a delay amount between the first signal and the delayed first signal is variable based upon the temperature signal, wherein, in response to the temperature signal, the delay amount decreases as the detected temperature increases.

16. A semiconductor device comprising:
    a temperature detection circuit that provides a temperature signal indicative of a detected temperature; and
    a first variable delay circuit comprising:
       an input for receiving a first signal;
       an output for outputting a delayed first signal;
       a transmission line on which the first signal is transmitted, the transmission line being arranged between the input and output and
       a plurality of capacitors each having a first electrode coupled to the transmission line and a second electrode that receives the temperature signal;
       wherein a delay amount between the first signal and the delayed first signal is variable based upon the temperature signal, wherein the first signal is a data strobe signal, and the delayed first signal is a delayed data strobe signal.

17. The semiconductor device of claim 16, further comprising a latch circuit that latches a data signal, a timing of the latch circuit being controlled by the delayed data strobe signal.

* * * * *